(12) United States Patent
Hsieh et al.

(10) Patent No.: US 10,640,366 B2
(45) Date of Patent: May 5, 2020

(54) BYPASS STRUCTURE

(71) Applicant: Taiwan Semiconductor Manufacturing Co., Ltd., Hsin-Chu (TW)

(72) Inventors: Eason Hsieh, Hsinchu (TW); Fei-Lung Lai, New Taipei (TW); Kuei-Sung Chang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/161,404

(22) Filed: Oct. 16, 2018

(65) Prior Publication Data

US 2020/0102212 A1 Apr. 2, 2020

Related U.S. Application Data

(60) Provisional application No. 62/737,220, filed on Sep. 27, 2018.

(51) Int. Cl.
| | |
|---|---|
| *B81C 1/00* | (2006.01) |
| *B81B 7/02* | (2006.01) |
| *B81B 7/00* | (2006.01) |
| *H01L 23/538* | (2006.01) |

(52) U.S. Cl.
CPC ............ *B81B 7/0006* (2013.01); *B81B 7/008* (2013.01); *B81C 1/0023* (2013.01); *H01L 23/5385* (2013.01); *B81B 2207/015* (2013.01)

(58) Field of Classification Search
CPC ..... H01L 27/14603; H02J 50/10; H02J 50/90; H02J 7/025; G01M 13/028; H05J 50/90
See application file for complete search history.

(56) References Cited

U.S. PATENT DOCUMENTS

| | | | | |
|---|---|---|---|---|
| 5,771,321 A | * | 6/1998 | Stern ........................ | G02B 6/35 385/146 |
| 2009/0149038 A1 | * | 6/2009 | Gabara ................... | H01L 23/48 439/55 |
| 2017/0053764 A1 | * | 2/2017 | Mori .................. | H01H 59/0009 |
| 2018/0206334 A1 | * | 7/2018 | Li ............................ | H01P 3/082 |

* cited by examiner

*Primary Examiner* — Caridad Everhart
(74) *Attorney, Agent, or Firm* — Eschweiler & Potashnik, LLC

(57) ABSTRACT

An integrated CMOS-MEMS device includes a first substrate having a CMOS device, a second substrate having a MEMS device, an insulator layer disposed between the first substrate and the second substrate, a dischargeable ground-contact, an electrical bypass structure, and a contrast stress layer. The first substrate includes a conductor that is conductively connecting to the CMOS devices. The electrical bypass structure has a conducting layer conductively connecting this conductor of the first substrate with the dischargeable ground-contact through a process-configurable electrical connection. The contrast stress layer is disposed between the insulator layer and the conducting layer of the electrical bypass structure.

20 Claims, 15 Drawing Sheets

A-A' plane

A-A' plane

US 10,640,366 B2

BYPASS STRUCTURE

REFERENCE TO RELATED APPLICATION

This Application claims priority to U.S. Provisional Application No. 62/737,220 filed on Sep. 27, 2018, the contents of which are hereby incorporated by reference in their entirety.

BACKGROUND

Microelectromechanical systems (MEMS) devices are electro-mechanical systems that can be incorporated into integrated circuit devices, such as integrated circuit devices fabricated using complementary metal-oxide-semiconductor (CMOS) fabrication technologies. Integrating CMOS devices with MEMS devices can improve the performance of the CMOS-MEMS system, allow for smaller packaging, and reduce manufacturing costs. Some techniques used for the CMOS-MEMS integration involve fabricating the integrated circuit with CMOS devices first using CMOS process before the MEMS device is processed. After the integrated circuit with CMOS devices is fabricated, the MEMS device is typically formed by etching a MEMS device layer disposed over the integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
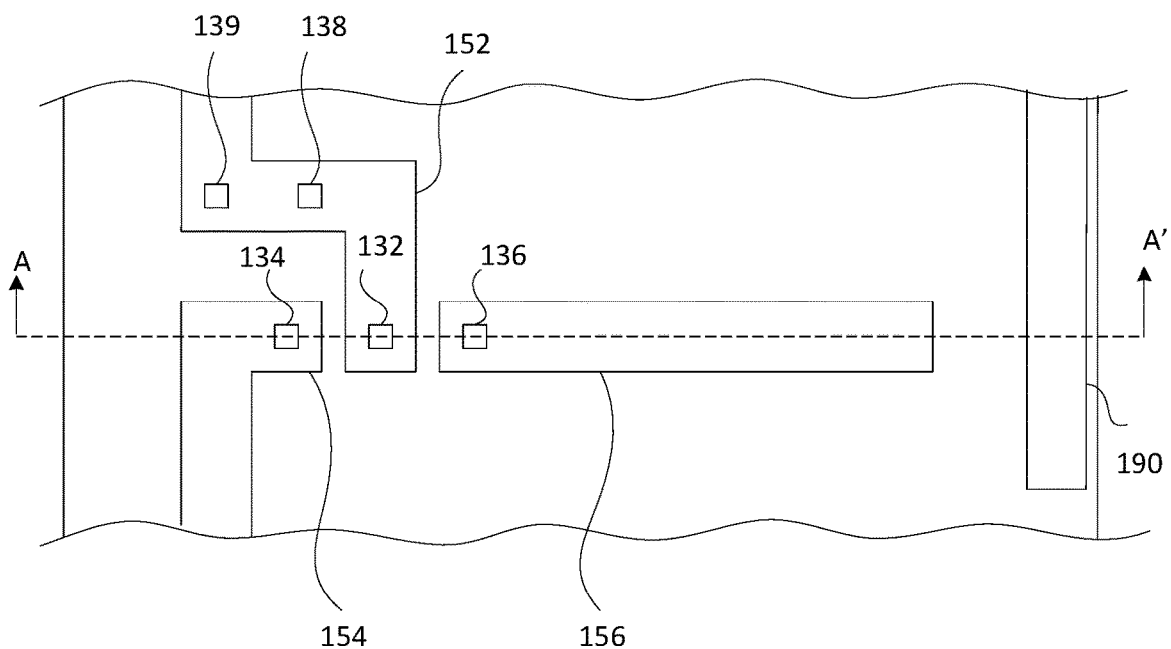
FIG. 1A is a top view of a part of an integrated circuit with CMOS devices in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
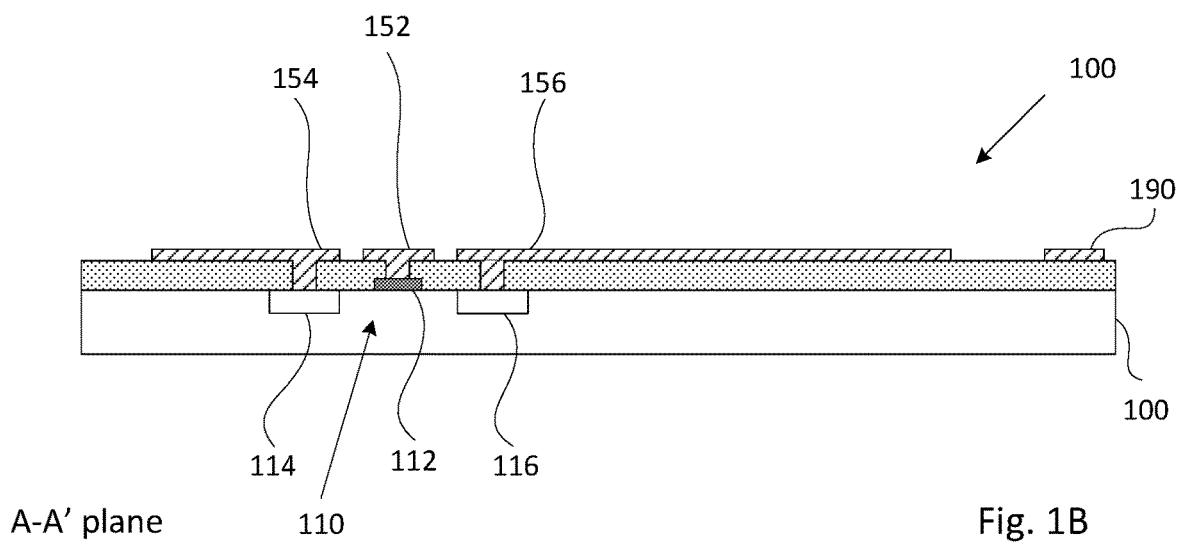
FIG. 1B is a side view showing a cross section A-A' of the part of the integrated circuit as shown in FIG. 1A in accordance with some embodiments.

FIG. 1A is a top view of a part of an integrated circuit with CMOS devices in accordance with some embodiments. FIG. 1B is a side view showing a cross section A-A' of the part of the integrated circuit as shown in FIG. 1A in accordance with some embodiments. In FIG. 1A, several conductors (e.g., 152, 154, and 156) and a dischargeable ground-contact 190 are shown in the top view. The conductors 152, 154, and 156 can be connected to other electronic components in the integrated circuit through conductive contacts in via-holes (e.g., 132, 134, 136, 138, and 139). For example, as shown in FIG. 1B, the conductors 152, 154, and 156 can be respectively connected to the gate 112, the source 114 and the drain 116 of a transistor 110 fabricated with the CMOS process in a first substrate 100. In the embodiments as shown in FIGS. 1A-1B, the conductors 152, 154, and 156 are all formed in a top metal layer. In some embodiments, in addition to the conductors 152, 154, and 156 in a top metal layer, there are other conductors in the top metal layer. In some embodiments, there are other metal layers between the top metal layer and a supporting substrate.

In FIG. 1B, the first substrate 100 includes a transistor 110. In some embodiments, the first substrate 100 may include other electronic components fabricated on the first substrate 100. Examples of these electronic components fabricated on the first substrate 100 include one or more of the following: transistors (for example, metal-oxide-semiconductor field-effect transistors (MOSFETs) including CMOS transistors, bipolar junction transistors (BJTs), high voltage transistors, high frequency transistors, p-channel and/or n-channel field-effect transistors (PFETs/NFETs), resistors, diodes, capacitors, inductors, fuses, or combinations thereof.

In FIG. 1B, the first substrate 100 includes a top metal layer. In some embodiments, the first substrate 100 may include various other layers. Examples of these various other layers include one or more of the following: high-k dielectric layers, gate layers, hard mask layers, interfacial layers, capping layers, diffusion/barrier layers, dielectric layers, conductive layers, or combinations thereof. The various layers of the first substrate 100 may also include various doped regions, isolation features, other features, or combinations thereof.

Figure 1C:
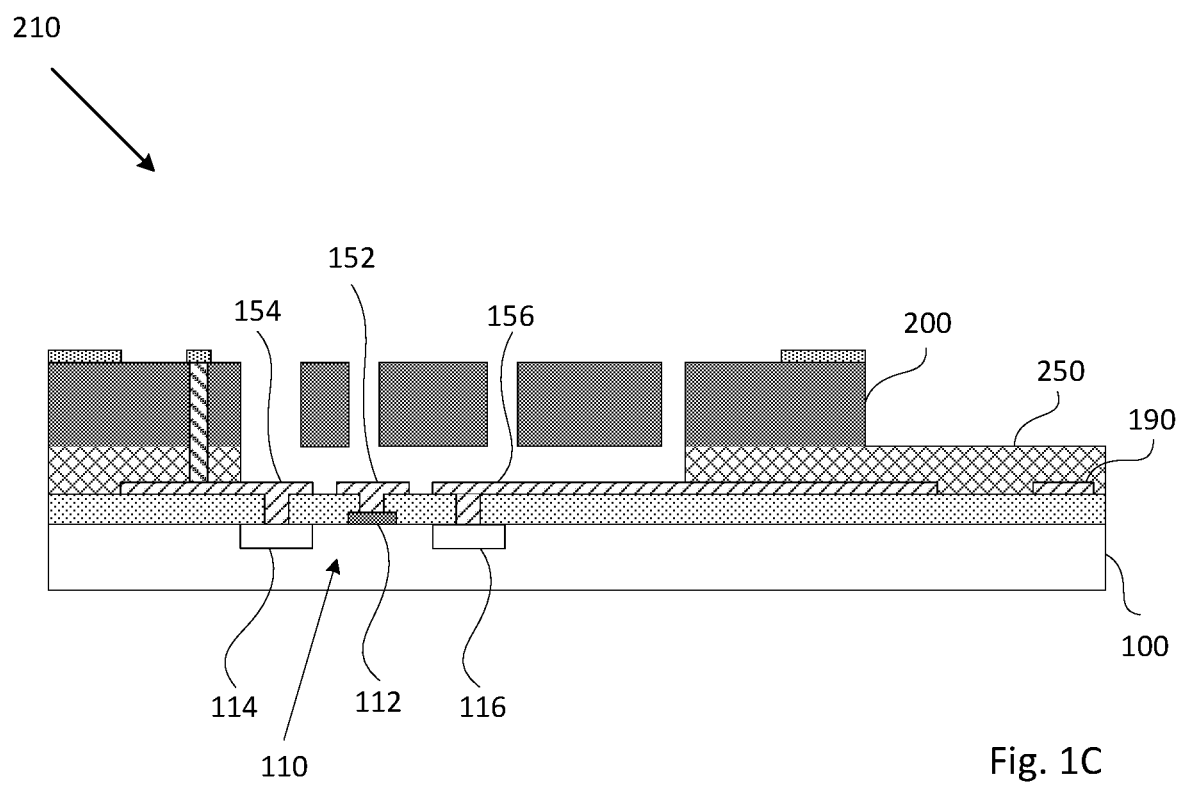
FIG. 1C is a side view showing a cross section of an integrated CMOS-MEMS device in accordance with some embodiments.

FIG. 1C is a side view showing a cross section of an integrated CMOS-MEMS device in accordance with some embodiments. In addition to the integrated circuit as shown in FIGS. 1A-1B, the integrated CMOS-MEMS device in FIG. 1C also includes a microelectromechanical system (MEMS) device 210 fabricated with a second substrate 200. In FIG. 1C, an insulator layer 250 is disposed between the first substrate 100 and the second substrate 200. The MEMS device 210 can include one or more electrical contacts that are conductively connected to the integrated circuit in the first substrate 100. For example, as shown in FIG. 1C, the electrical contact 215 of the CMOS-MEMS device can be conductively connected to one of the terminals of the transistor 110 fabricated with the CMOS process.

The fabrication of the MEMS device 210 may involve plasma etching. Charges induced by the plasma etching can be accumulated in different parts of the MEMS device 210. These accumulated charges can cause damage to CMOS devices in the first substrate 100. For example, charges induced by the plasma etching can be transferred to the source 114 of the transistor 110 from the MEMS device 210 through the conductor between the electrical contact 215 and the source 114 of the transistor 110. Charges induced by the plasma etching can also be transferred to the drain 116 of the transistor 110 or gate 112 of the transistor 110 through different conducting paths connecting the MEMS device 210. The charges transferred to different terminals of the transistor 110 can raise the voltage potential at each of these terminals to different levels, and large potential differences between these terminals can damage the transistor 110. Therefore, CMOS devices are susceptible to damage caused by accumulated charges. Protection structures, such as bypassing structures for charge releasing, may be implemented to prevent CMOS devices in the first substrate 100 from being damaged during the fabrication process of the MEMS device 210.

Figure 2A:
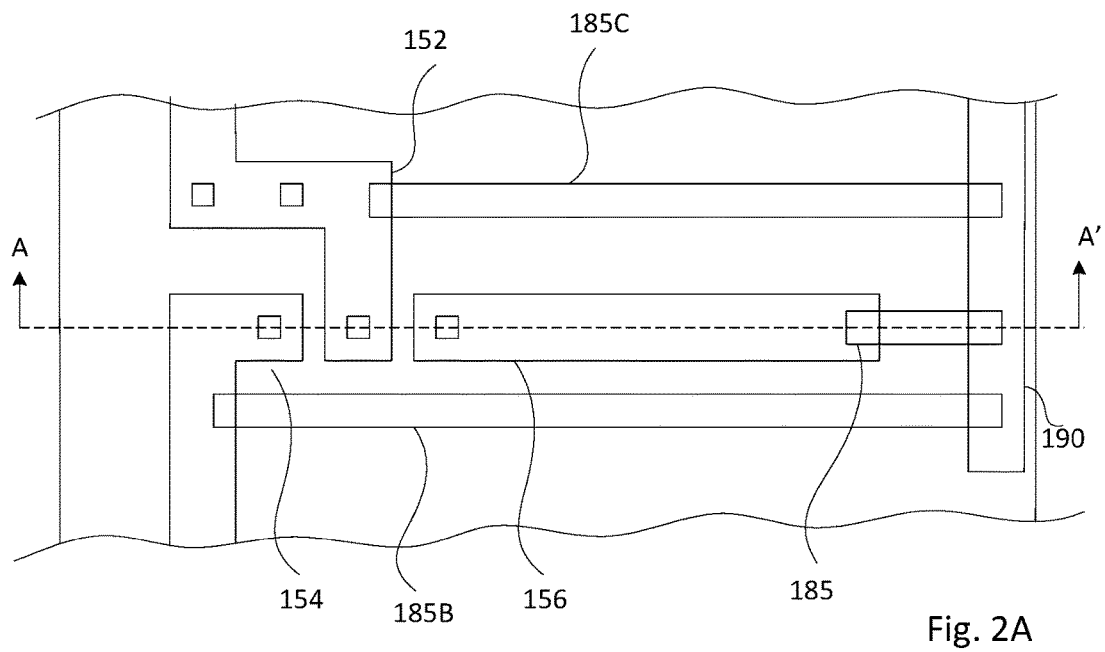
FIG. 2A is a top view of a part of an integrated circuit with CMOS devices having bypassing structures for charge releasing in accordance with some embodiments.
Figure 2B:
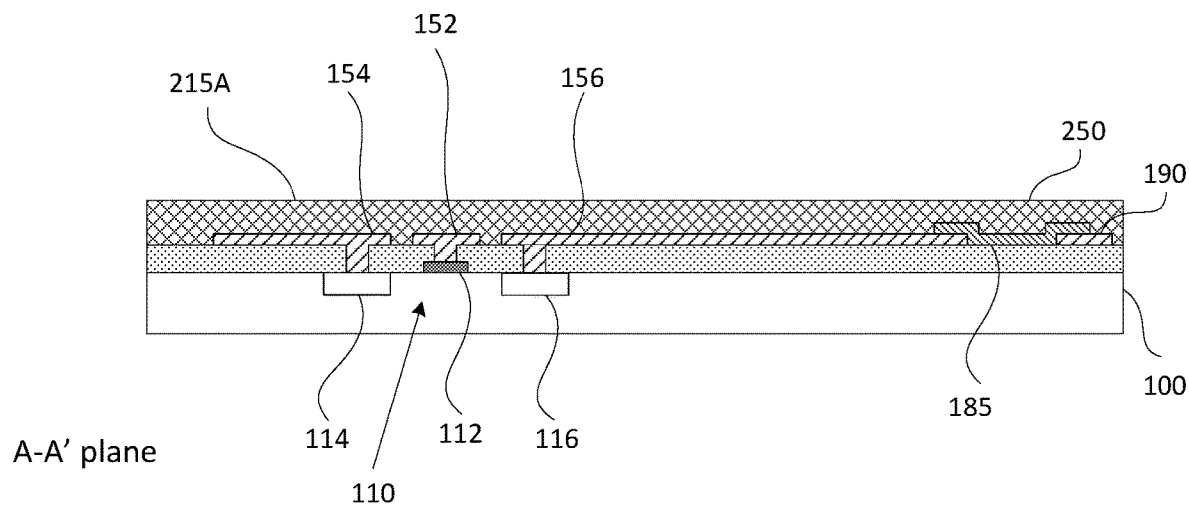
FIG. 2B is a side view showing a cross section A-A' of the part of the integrated circuit as shown in FIG. 2A in accordance with some embodiments.

FIG. 2A is a top view of a part of an integrated circuit with CMOS devices having bypassing structures for charge releasing in accordance with some embodiments. FIG. 2B is a side view showing a cross section A-A' of the part of the integrated circuit as shown in FIG. 2A in accordance with some embodiments. In FIG. 2A, electrical bypass structures 185, 185B, and 185C are implemented to connect conductors in the first substrate to a dischargeable ground-contact 190. For example, electrical bypass structures 185, 185B, and 185C connect the dischargeable ground-contact 190 respectively to the conductors 152, 154, and 156. In one example, as shown in FIG. 2B, the electrical bypass structure 185 has a conducting layer 186 disposed between the first substrate 100 and the insulator layer 250.

Figure 2C:
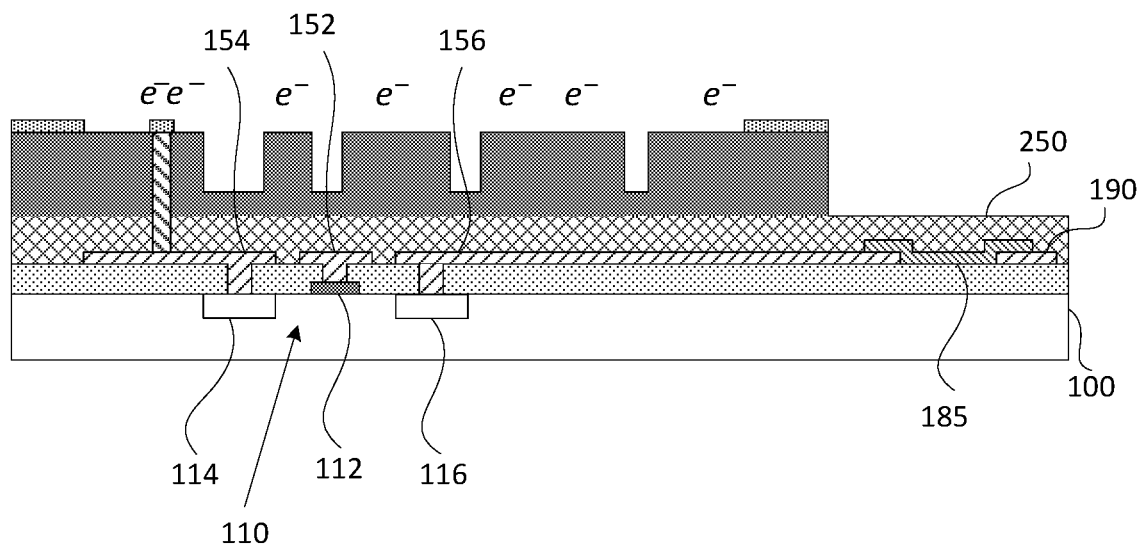
FIG. 2C is a side view showing a cross section of a partially etched substrate for the MEMS device that is integrated with the integrated circuit of FIG. 2A in accordance with some embodiments.

FIG. 2C is a side view showing a cross section of a partially etched substrate for the MEMS device that is integrated with the integrated circuit of FIG. 2A in accordance with some embodiments. During the plasma etching process, charges induced by the plasma etching (as shown in the figure as "e⁻") can be accumulated in different parts of the MEMS device 210. For preventing the transistor 110 from being damaged during the plasma etching process, charges accumulated in the gate 112, the source 114, and the drain 116 of the transistor 110 can be released to the dischargeable ground-contact 190 respectively through the electrical bypass structures 185, 185B, and 185C as shown in FIG. 2A. The electrical bypass structures 185, 185B, and 185C can bring the gate 112, the source 114, and the drain 116 of the transistor 110 to substantially equal potential, preventing damages to the transistor 110 due to large potential differences caused by accumulated charges. In some embodiments, the dischargeable ground-contact 190 can be a contact that is shared with other ground contacts, such as the analog ground or the digital ground of the integrated circuit. In some embodiments, the dischargeable ground-contact 190 can be different from the analog ground or the digital ground of the integrated circuit. In some embodiments, the dischargeable ground-contact 190 can be formed with a conductor layer that has an ohmic contact with the silicon substrate for fabricating the CMOS devices in the integrated circuit. In some embodiments, the dischargeable ground-contact 190 can be formed with a conductor layer that is in conductive contact with a bulky metal.

In FIG. 2A, the electrical bypass structures 185, 185B, and 185C connects conductors 152, 154, and 156 respectively to the dischargeable ground-contact 190 through a process-configurable electrical connection. The process-configurable electrical connection can be in an open configuration or a closed configuration. When the process-configurable electrical connection is in the closed configuration, the conductors 152, 154, and 156 are conductively connected to the dischargeable ground-contact 190. When the process-configurable electrical connection is in the open configuration, the conductors 152, 154, and 156 are isolated from the dischargeable ground-contact 190. The process-configurable electrical connection generally can be changed from the closed configuration to the open configuration at later stage of the fabrication process, for example, after the MEMS device 210 is fabricated.

In the embodiments as shown in FIGS. 2A-2C, three electrical bypass structures 185, 185B, and 185C are implemented to connect the dischargeable ground-contact 190 to the conductors 152, 154, and 156 respectively. In other embodiments, not all of the three conductors 152, 154, and 156 are connected to the dischargeable ground-contact 190 with bypassing structures. For example, two bypassing structures can be implemented to connect separately only two of the three conductors 152, 154, and 156 to the dischargeable ground-contact 190. In another example, one bypassing structure can be implemented to connect only one of the three conductors 152, 154, and 156 to the dischargeable ground-contact 190.

Figure 3A:
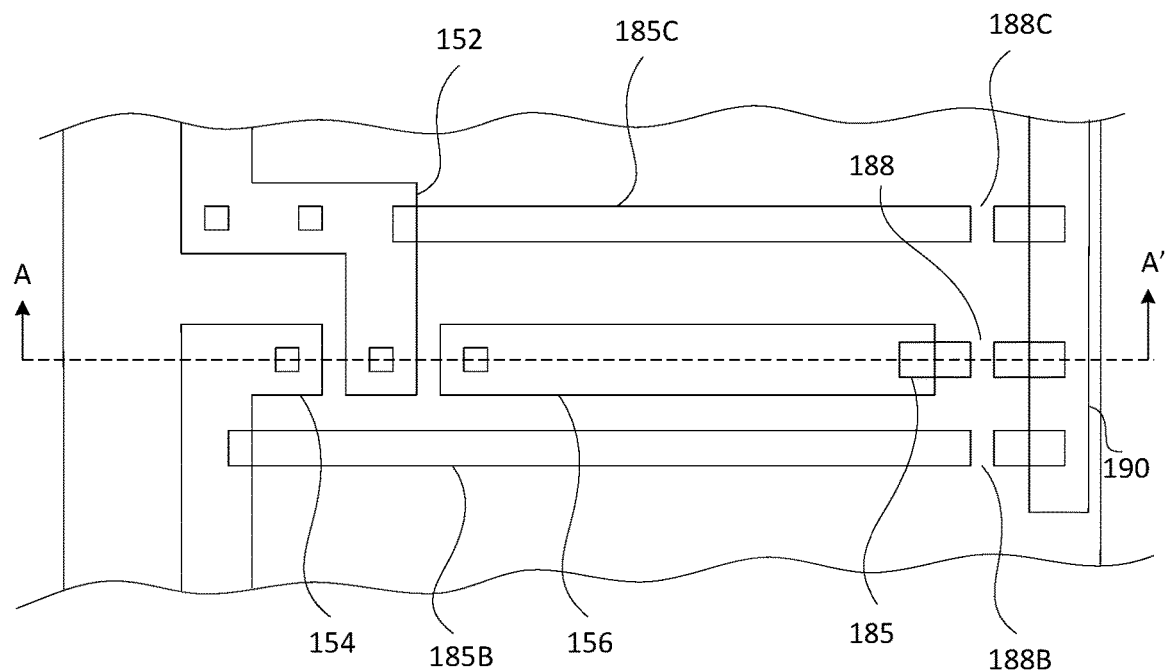
FIG. 3A is a top view of a part of an integrated circuit in an integrated CMOS-MEMS device having bypassing structures when the process-configurable electrical connection is in the open configuration in accordance with some embodiments.
Figure 3B:
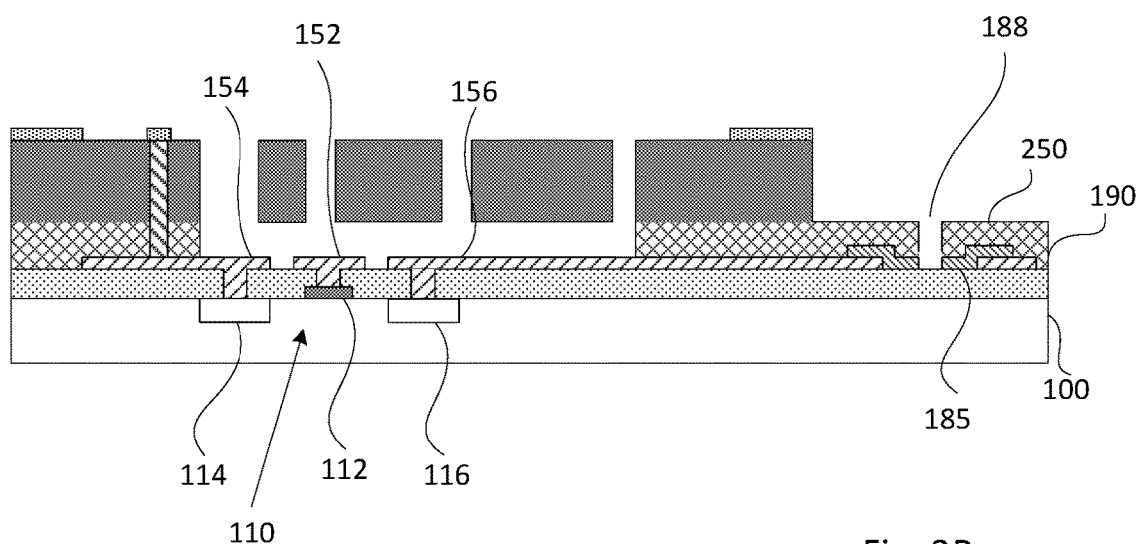
FIG. 3B is a side view showing a cross section A-A' of the integrated CMOS-MEMS device as shown in FIG. 3A in accordance with some embodiments.

FIG. 3A is a top view of a part of an integrated circuit in an integrated CMOS-MEMS device having by passing structures when the process-configurable electrical connection is in the open configuration in accordance with some embodiments. FIG. 3B is a side view showing a cross section A-A' of the integrated CMOS-MEMS device as shown in FIG. 3A in accordance with some embodiments. In the embodiments as shown in FIGS. 3A-3B, the process-configurable electrical connection in the electrical bypass structures 185, 185B, and 185C can be changed from the closed configuration to the open configuration with an etching process to open gaps 188, 188B, and 188C in the connections of the bypassing structures. When the gaps 188, 188B, and 188C are opened, the conductors 152, 154, and 156 are isolated from the dischargeable ground-contact 190. In some embodiments, the process-configurable electrical connection in the bypassing structures can be a fuse-type structure; the conductors 152, 154, and 156 can be isolated from the dischargeable ground-contact 190 after the fuse-type structure is changed into a disconnected state. The fuse-type structure can be disconnected by thermal means, mechanical means, or electrical means.

Referring to FIG. 3B, in some embodiments, the conductors 152, 154, and 156 are formed with a layer of Titanium Nitride (TiN). In some embodiments, the insulator layer 250 on top of the layer of Titanium Nitride (TiN) for the conductors 152, 154, and 156 is a layer of silicon oxide ($SiO_2$). Applicant found that the layer of Titanium Nitride (TiN) for the conductors 152, 154, and 156 can be peeled-off when the insulator layer 250 is deposited on top of the layer of Titanium Nitride (TiN). It is desirable to develop techniques that can prevent the conducting layer in the bypassing structures from being peeled-off.

Figure 4A:
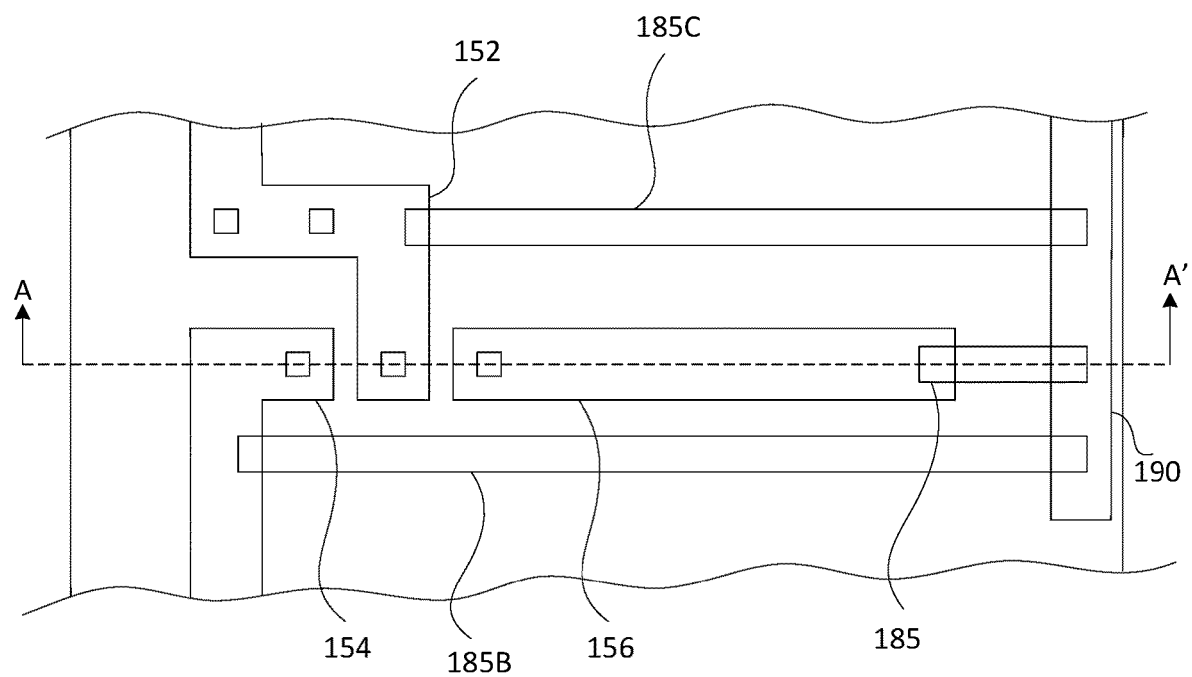
FIG. 4A is a top view of a part of an integrated circuit with CMOS devices in accordance with some embodiments.
Figure 4B:
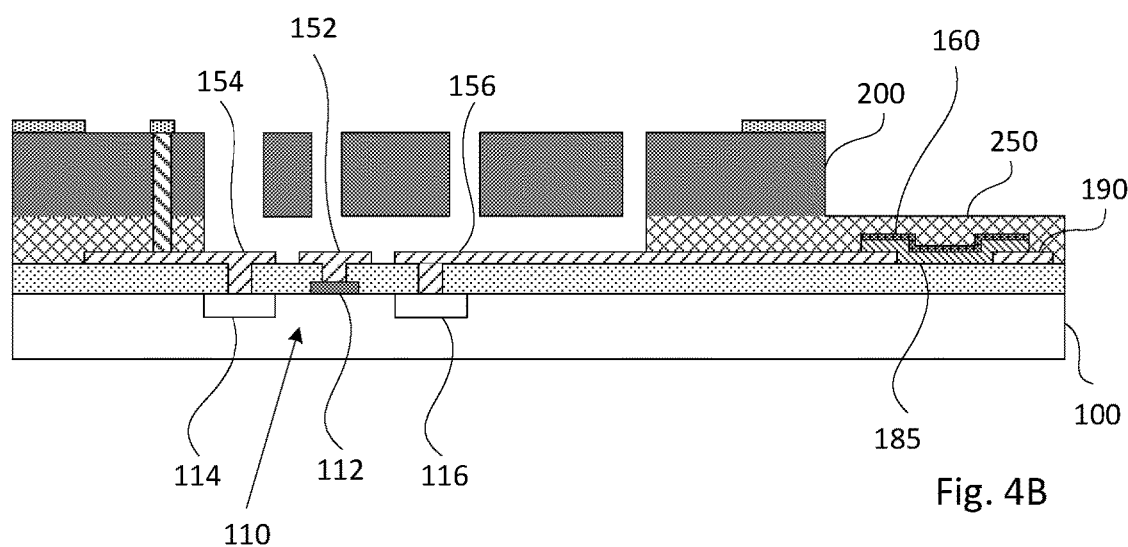
FIG. 4B is a side view showing a cross section A-A' of the integrated CMOS-MEMS device as shown in FIG. 4A that has a contrast stress layer when forming the bypassing structures in accordance with some embodiments.
Figure 4C:
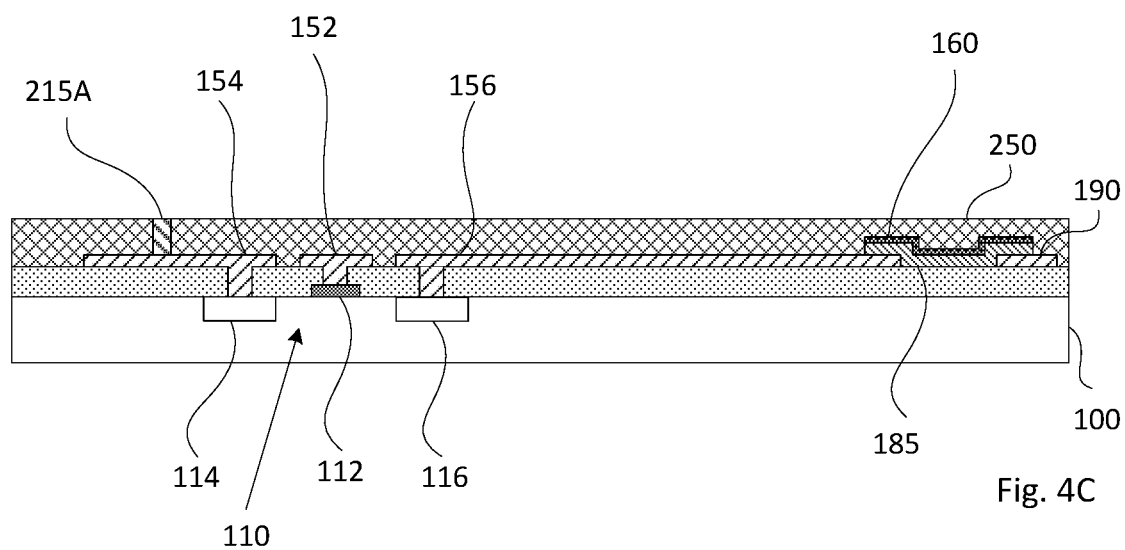
FIG. 4C is a side view showing the cross section A-A' of the integrated circuit with CMOS devices in FIG. 4A before it is integrated with the MEMS device in accordance with some embodiments.

FIG. 4A is a top view of a part of an integrated circuit with CMOS devices in accordance with some embodiments. FIG. 4B is a side view showing a cross section A-A' of the integrated CMOS-MEMS device as shown in FIG. 4A that has a contrast stress layer when forming the bypassing structures in accordance with some embodiments. FIG. 4C is a side view showing the cross section A-A' of the integrated circuit with CMOS devices in FIG. 4A before it is integrated with the MEMS device in accordance with some embodiments.

In FIG. 4C, a contrast stress layer 160 is disposed between the insulator layer 250 and the conducting layer of the electrical bypass structure 185. The internal stress in the contrast stress layer 160 can be selected to be opposite in sign to the internal stress in the conducting layer of the electrical bypass structure 185. In some implementations, when the internal stress in the conducting layer of the electrical bypass structure is tensile, the internal stress of the contrast stress layer can be selected to be compressive. In some implementations, when the internal stress in the conducting layer of the electrical bypass structure is compressive, the internal stress of the contrast stress layer can be selected to be tensile. For example, when the conductors 152, 154, and 156 are formed with a layer of Titanium Nitride (TiN) and the insulator layer 250 is a layer of silicon oxide ($SiO_2$), both the layer of Titanium Nitride (TiN) and the insulator layer 250 is compressive, and a contrast stress layer that is tensile can be deposited between the layer of Titanium Nitride (TiN) and the insulator layer 250. In this example, one possible selection for the tensile contrast stress layer is a layer of Titanium (Ti).

It is possible to have the internal stress in the contrast stress layer 160 be selected to be opposite in sign to the internal stress in the insulator layer 250. In some implementations, when the internal stress in the insulator layer 250 is tensile, the internal stress of the contrast stress layer 160 can be selected to be compressive. In some implementations, when the internal stress in the insulator layer 250 is compressive, the internal stress of the contrast stress layer 160 can be selected to be tensile.

Figure 5A:
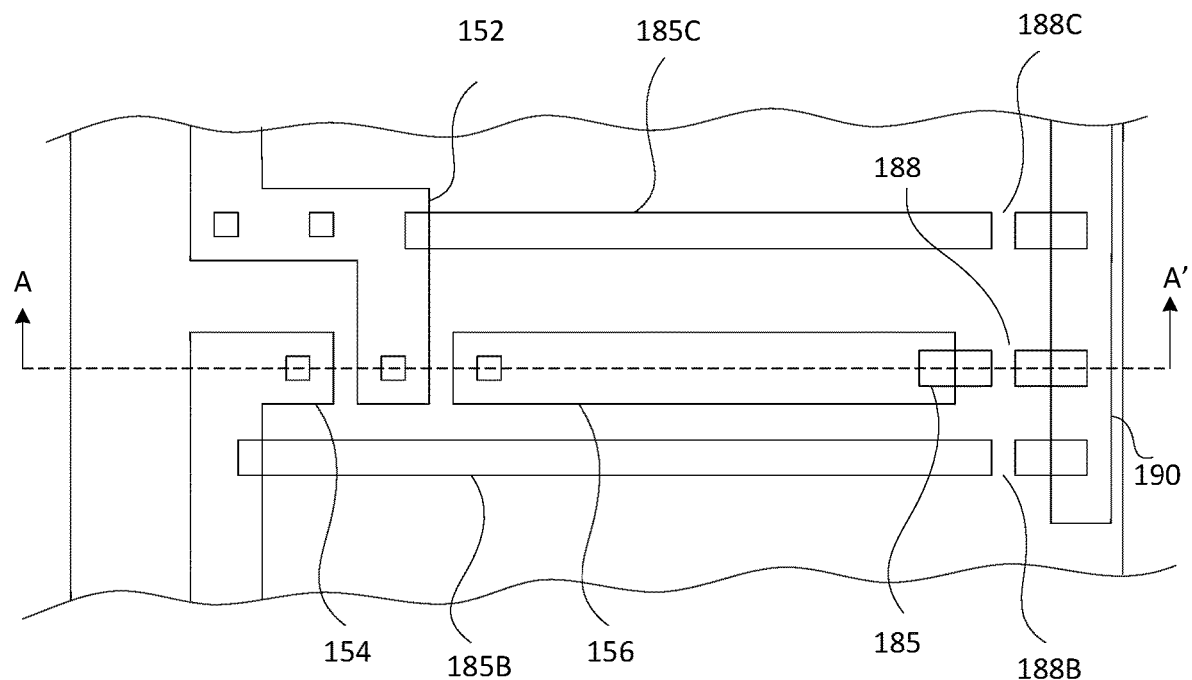
FIG. 5A is a top view of a part of an integrated circuit with CMOS devices having bypassing structures with a contrast stress layer in accordance with some embodiments.
Figure 5B:
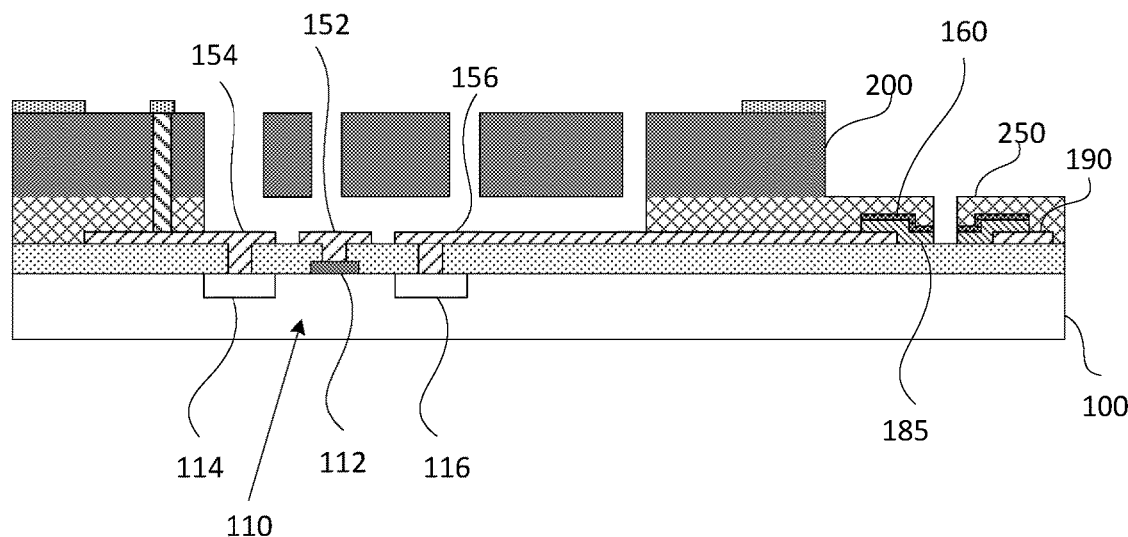
FIG. 5B is a side view showing a cross section A-A' of the integrated CMOS-MEMS device as shown in FIG. 5A in accordance with some embodiments.

With the contrast stress layer 160 disposed between the insulator layer 250 and the conducting layer of the electrical bypass structures 185, the electrical bypass structures 185 can still be implemented to isolate the conductors 152, 154, and 156 from the dischargeable ground-contact 190 after the fabrication of the MEMS device 210. FIG. 5A is a top view of a part of an integrated circuit with CMOS devices having bypassing structures with a contrast stress layer in accordance with some embodiments. FIG. 5B is a side view showing a cross section A-A' of the integrated CMOS-MEMS device as shown in FIG. 5A in accordance with some embodiments. In the embodiments as shown in FIGS. 5A-5B, the process-configurable electrical connection in the electrical bypass structures 185, 185B, and 185C can be changed from the closed configuration to the open configuration, for example, by etching through both the conducting layer and the contrast stress layer to open up the gaps 188, 188B, and 188C. When these gaps are opened, the conductors 152, 154, and 156 are isolated from the dischargeable ground-contact 190.

Figure 6:
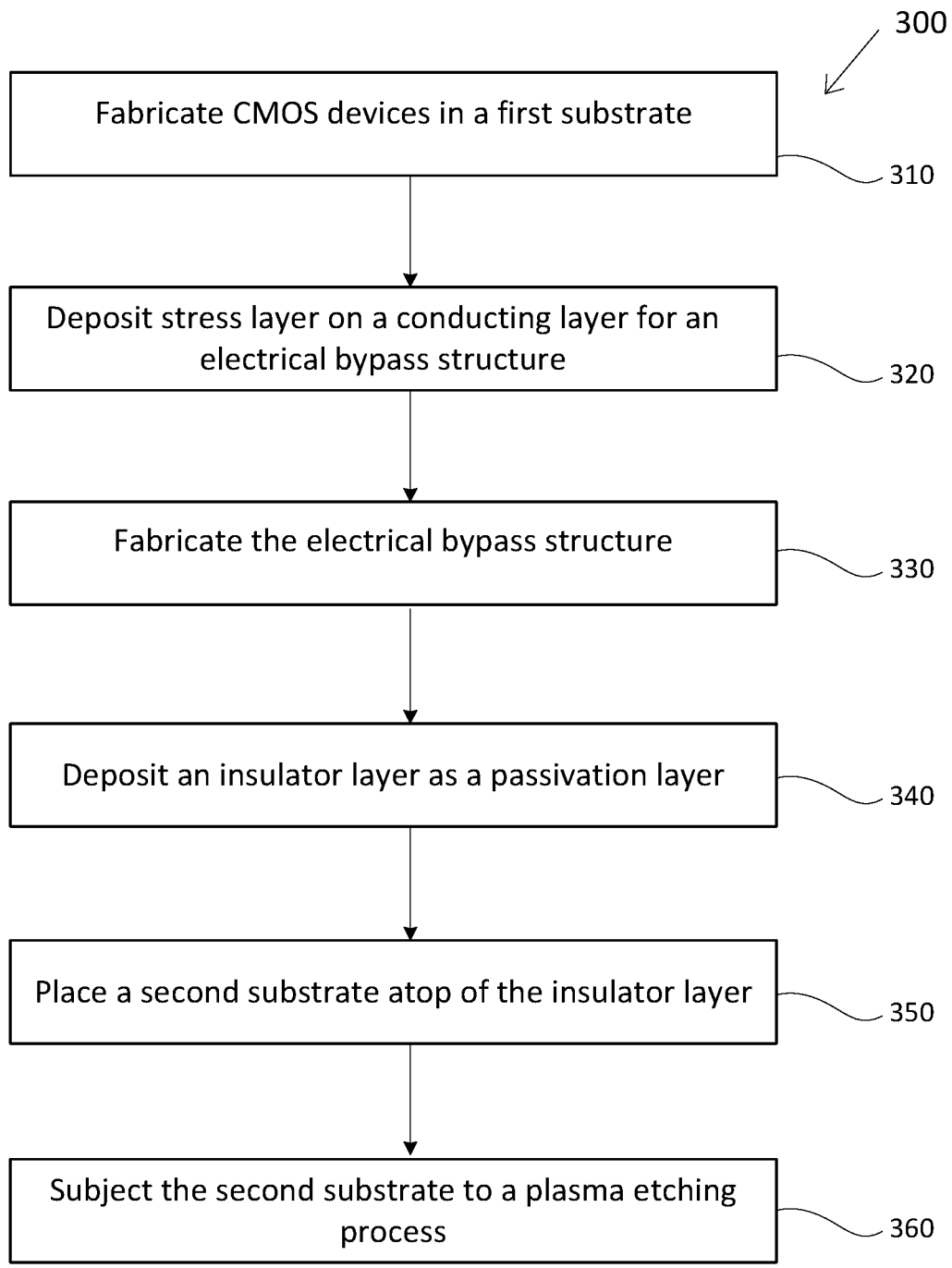
FIG. 6 is a flow chart showing a method of fabricating an integrated CMOS-MEMS device that has a contrast stress layer when forming the bypassing structures in accordance with some embodiments.

FIG. 6 is a flow chart showing a method of fabricating an integrated CMOS-MEMS device that has a contrast stress layer when forming the bypassing structures in accordance with some embodiments. FIGS. 7A-7J are cross-section views of device structures for showing a method of fabricating an integrated CMOS-MEMS device in accordance with some embodiments.

Figure 7A:
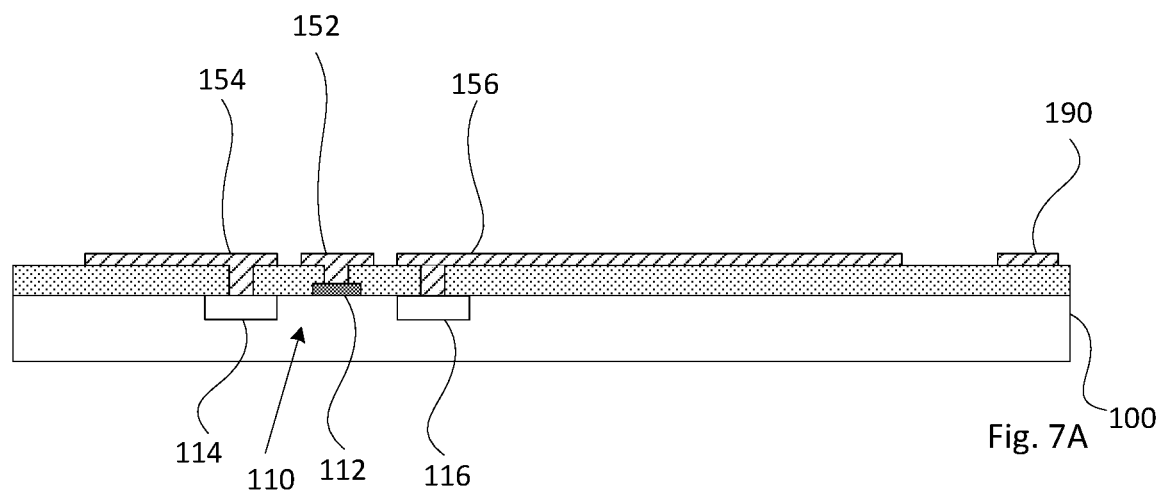
FIGS. 7A-7J are cross-section views of device structures for showing a method of fabricating an integrated CMOS-MEMS device in accordance with some embodiments.

With the method 300 as shown in FIG. 6, at 310, integrated circuits having CMOS devices are fabricated in a first substrate using a CMOS process. In some embodiments, the CMOS devices fabricated using the CMOS process can include a transistor, such as, the transistor 110 as shown in FIG. 7A. The transistor 110 in FIG. 7A can be a transistor in a CMOS logic circuit or a transistor in an analog circuit. Near the final stage of CMOS process, routing conductors for connecting various CMOS devices and other electronic components are fabricated in the top metal layer. For example, as shown in FIG. 7A, the conductors 152, 154, and 156 are fabricated in the top metal layer; the dischargeable ground-contact 190 can also be fabricated in the top metal layer. As shown in FIG. 7A, the conductors 152, 154, and 156 are respectively connected to the gate 112, the source 114 and the drain 116 of the transistor 110. In some embodiments, there are other electronic devices fabricated on the transistor 110, such as, diodes, resistors, and capacitors. In addition to the top metal layer with conductors 152, 154, and 156, in some embodiments, there are other conductive layers for making electrical connections between various electronic devices fabricated on the transistor 110.

Referring to FIG. 6, at 320, a contrast stress layer on a conducting layer is deposited for an electrical bypass structure. In one example, a layer of Titanium Nitride (TiN) as the conducting layer can be first deposited, and subsequently, a layer of Titanium (as the tensile contrast stress layer) is deposited on the layer of Titanium Nitride (TiN). In one implementation, the layer of Titanium can be in a range from 100 angstrom to 500 angstrom. In one implementation, the ratio of bypass area (contrast area) is in a range from about 0.83% to about 1.09%. In some embodiments, the internal stress in the contrast stress layer 160 can be selected to be opposite in sign to the internal stress in the conducting layer of the electrical bypass structure 185. For example, when the internal stress in the conducting layer of the electrical bypass structure is tensile, the internal stress of the contrast stress layer can be compressive; when the internal stress in the conducting layer of the electrical bypass structure is compressive, the internal stress of the contrast stress layer can be tensile.

Next at 330, the electrical bypass structures are fabricated, and the conductors in the electrical bypass structures can be connected to a ground pad with various conductors that are connected to one or more CMOS devices. In one example, the electrical bypass structures can be fabricated with photolithograph techniques to make some patterns as designed in the layer of Titanium and the layer of Titanium Nitride. In some embodiments, as shown in FIGS. 7B-7D, the electrical bypass structures 185 can be fabricated using a lift-off process.

Figure 7B:
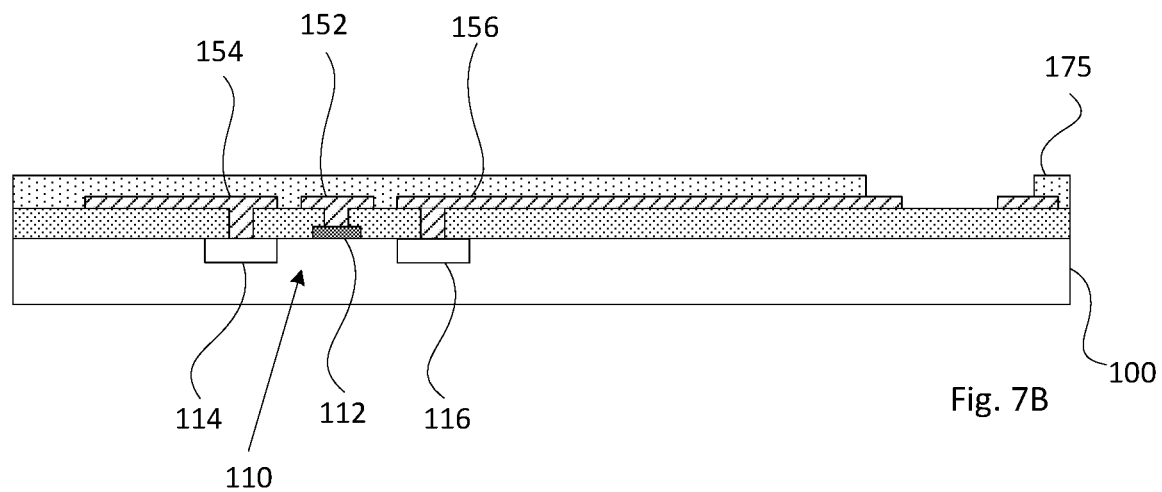
Figure 7C:
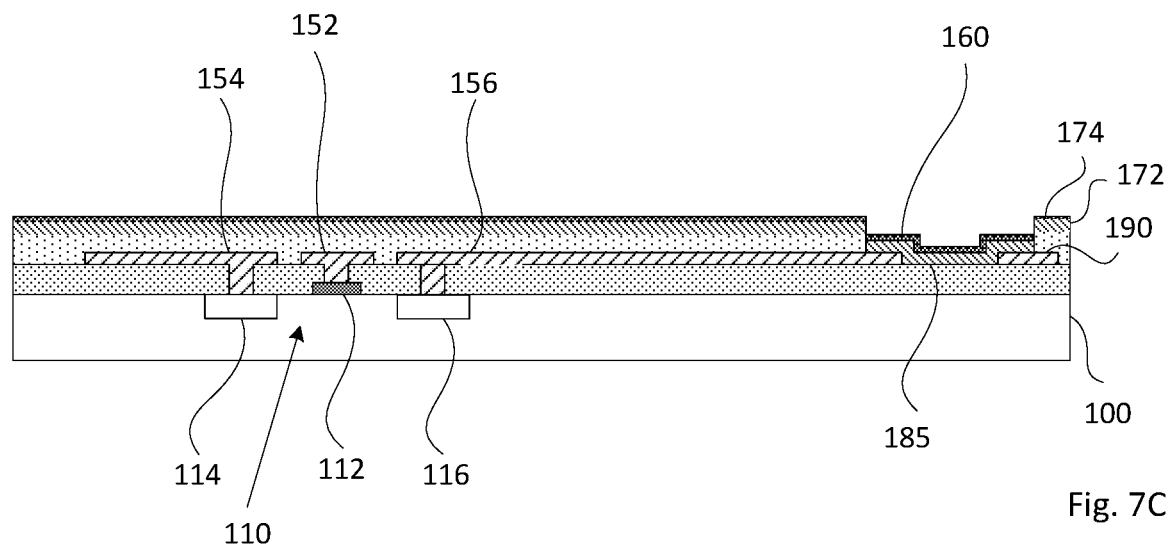
Figure 7D:
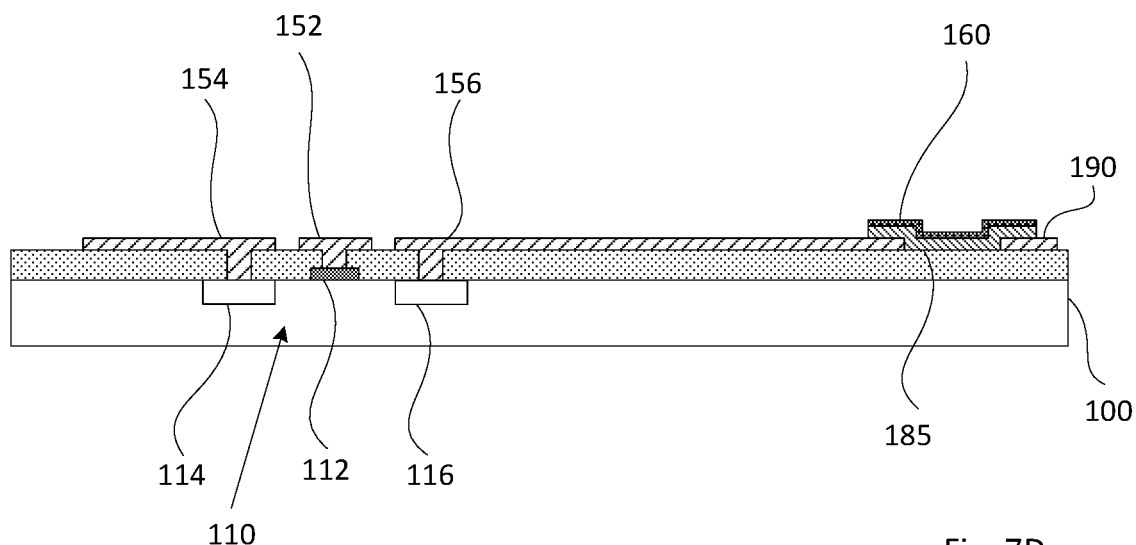

For example, as shown in FIG. 7B, designed pattern for the electrical bypass structures can be formed in a layer of photoresist 175 using a photolithography process. Then, as shown in FIG. 7C, a conducting layer 172 is first formed by a deposition process, then, a contrast stress layer 174 is deposited on the conducting layer 172. The deposition processes for forming the conducting layer 172 and/or the contrast stress layer 174 can include chemical vapor deposition (CVD), physical vapor deposition (PVD), atomic layer deposition (ALD), or other suitable deposition techniques. Next, as shown in FIG. 7D, when the layer of photoresist 175 is stripped off, the parts of the conducting layer 172 along with the contrast stress layer 174 on top of the corresponding parts of the conducting layer 172 are removed, and the electrical bypass structure 185 is formed as a result.

Figure 7E:
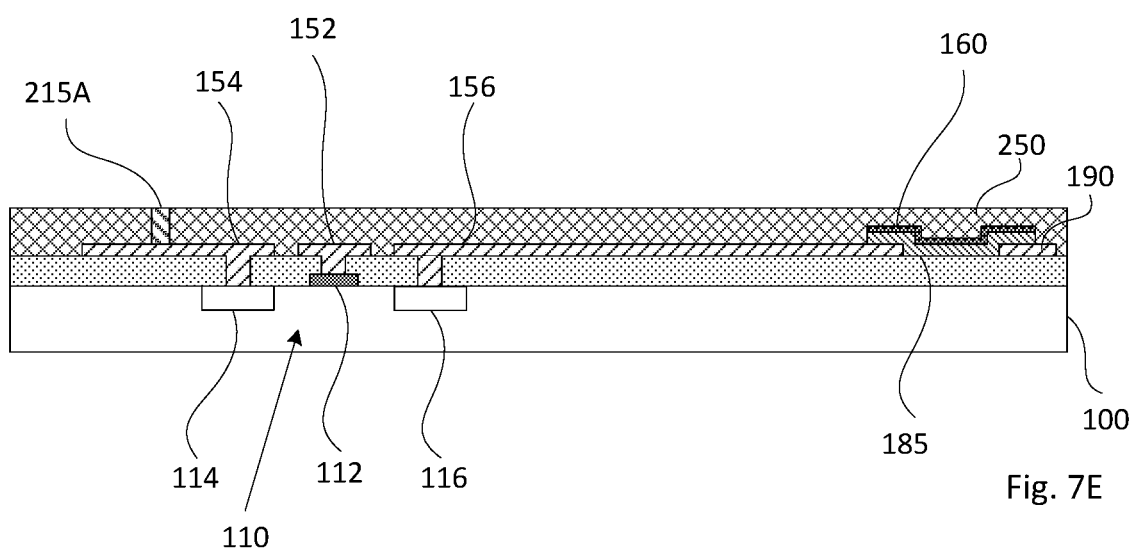

Next at 340, an insulator layer is deposited on top of the first substrate as a passivation layer. After the deposition process, this insulator layer is subject to a polish process, such as chemical mechanical polishing (CMP) process, for planarization. The insulator layer is thinned down to a thickness as designed during the CMP process. In FIG. 7E, the first substrate 100 covered with the insulator layer is shown with a side view. Because of the contrast stress layer on the conducting layer, the electrical bypass structure 185 as shown in FIG. 7E has advantages over the electrical bypass structure as shown in FIG. 2C. For example, the conducting layer of the electrical bypass structure 185 in FIG. 7E is less likely to be peeled-off after the deposition of the insulator layer 250, while the functions of the electrical bypass structures can be maintained as designed. In some embodiments, as shown in FIG. 7E, via-holes and conductive contacts (e.g., 215A) are made in the insulator layer 250, with photolithography and deposition processes, before the subsequent processing steps for fabricating the MEMS device on top of the insulator layer 250. In some embodiments, the insulator layer 250 can be an oxide layer, such as a silicon oxide layer. In some embodiments, the insulator layer 250 may include silicon nitride, silicon oxynitride, other suitable material, or combinations thereof.

Figure 7F:
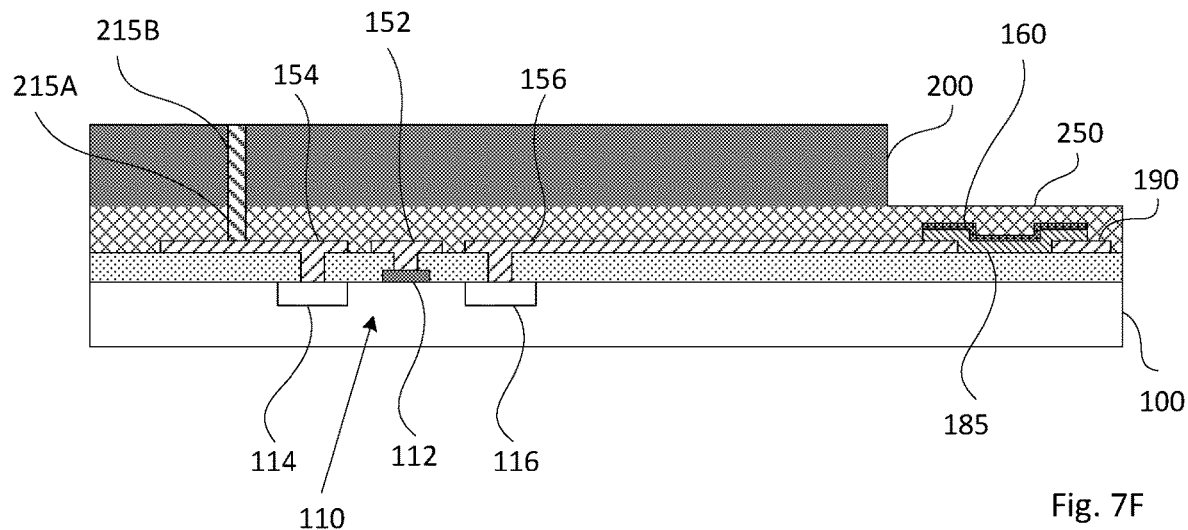

Next at 350, a second substrate 200 is placed atop of the insulator layer 250. In some embodiments, as shown in FIG. 7F, this second substrate 200 can be formed by depositing an insulation layer on top of the insulator layer 250. For example, a layer of silicon can be deposited on top of the insulator layer 250 with a suitable technique, such as chemical vapor deposition (CVD). In some embodiments, this second substrate 200 can be a prefabricated substrate that gets bonded to the top of the insulator layer 250. Large number of possible prefabricated substrate can be selected for bonding, on the top of the insulator layer 250, with the first substrate 100. In some embodiments, the second substrate 200 can include crystalline silicon or polycrystalline silicon. In some embodiments, the second substrate 200 can include silicon compounds (such as, Silicon Dioxide, Silicon Carbide, or Silicon Nitride), Quartz, Gallium Arsenide, Piezoelectric Crystals, Polymers, or combinations thereof. In some embodiments, as shown in FIG. 7F, via-holes, such as 215B, are made in the second substrate 200 with photolithography and deposition processes, before next processing step is carried out.

Figure 7G:
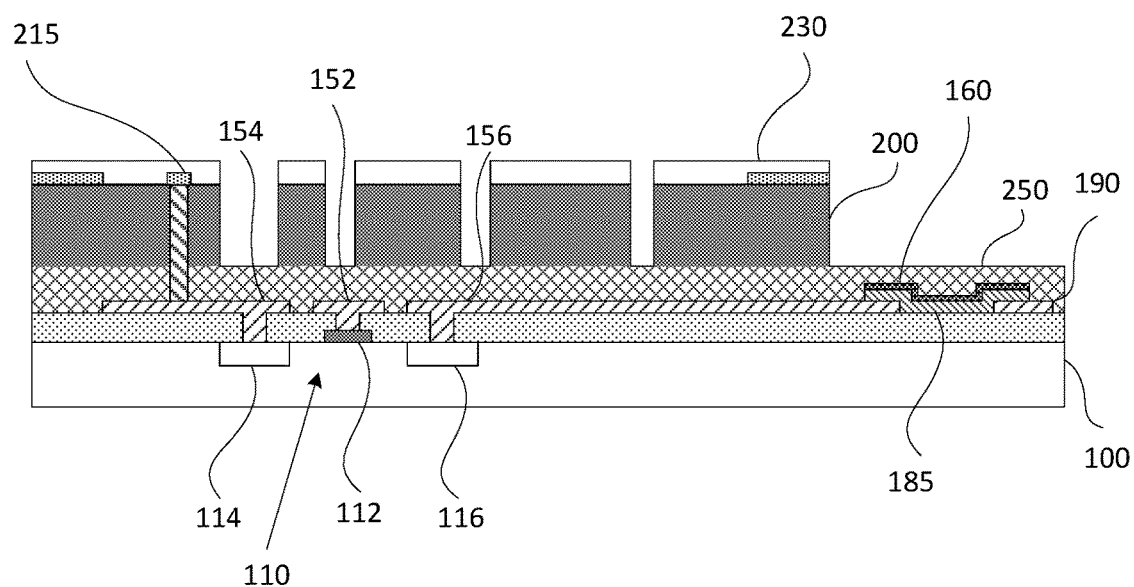

Next at 360, a MEMS device can be formed with the second substrate 200; in one of the steps for forming the MEMS device, the second substrate may need to be subject to a plasma etching process. In some embodiments, as shown in FIG. 7G, mask patterns for plasma etching can be formed in a layer of photoresists 230. Before the coating of the layer of photoresists 230 as shown in FIG. 7G, conductive contacts, such as 215, are made using photolithography and deposition processes. In FIG. 7G, the substrate 200 is etched to form structures according to the mask patterns in the layer of photoresists 230. During this plasma etching process, charges induced by the plasma can be discharged to the dischargeable ground-contact 190 via the electrical bypass structure 185. Examples of the MEMS device that can be formed at 360 of method 300 include a motion sensor (such as, a gyroscope or an accelerometer), a RF MEMS device (such as, an RF switch, resonator, or filter), an optical MEMS device (such as, a MEMS micro-mirror), a MEMS oscillator, a MEMS microphone, and/or any other MEMS type device. In some embodiments, the MEMS device may also include one or more nanoelectromechanical elements.

Figure 7H:
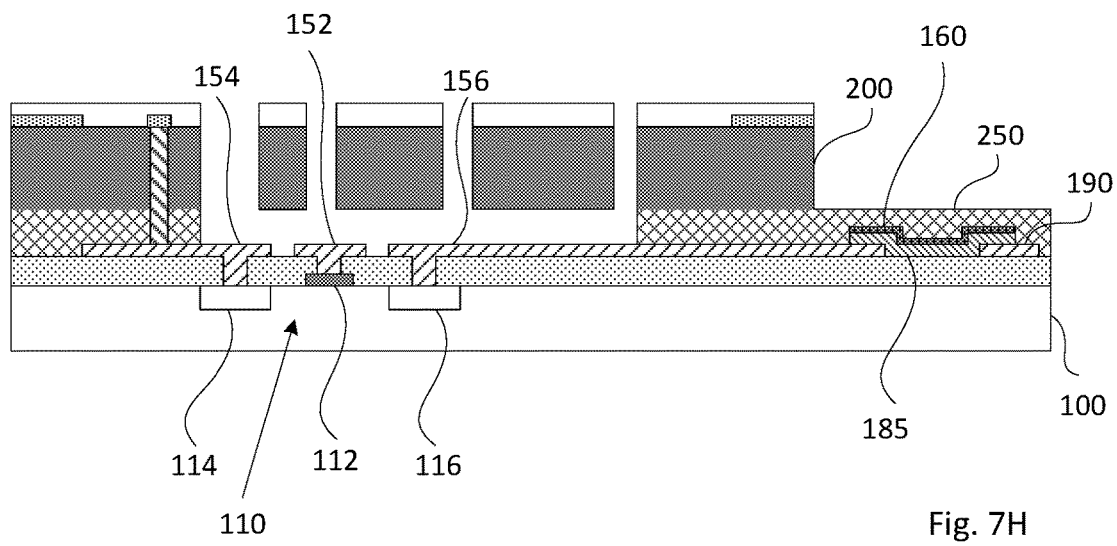

The dischargeable the electrical bypass structure 185 can be used to protect the electronic devices (such as CMOS devices) that are already fabricated in the substrate 100 during plasma etching process and/or other processing steps for the MEMS fabrication. Any charge induced by these processing steps can be discharged to the dischargeable ground-contact 190 via the electrical bypass structure 185. These processing steps may include deposition processes such as physical vapor deposition or chemical vapor deposition processes, oxygen plasma etching processes, argon plasma sputter cleaning processes, other plasma environment processes, or combinations thereof. In some embodiments, as shown in FIG. 7H, after the substrate 200 is etched with plasma, parts of the insulator layer 250 (such as silicon oxide) can be removed with wet etching. Examples of the wet etchant that can be used for removing parts of the insulator layer 250 include hydrofluoric acid (HF), Buffered Oxide Etch (BOE) solution (6 parts 40% NH4F and 1 part 49% HF), or Tetramethylammonium hydroxide (TMAH).

Figure 7I:
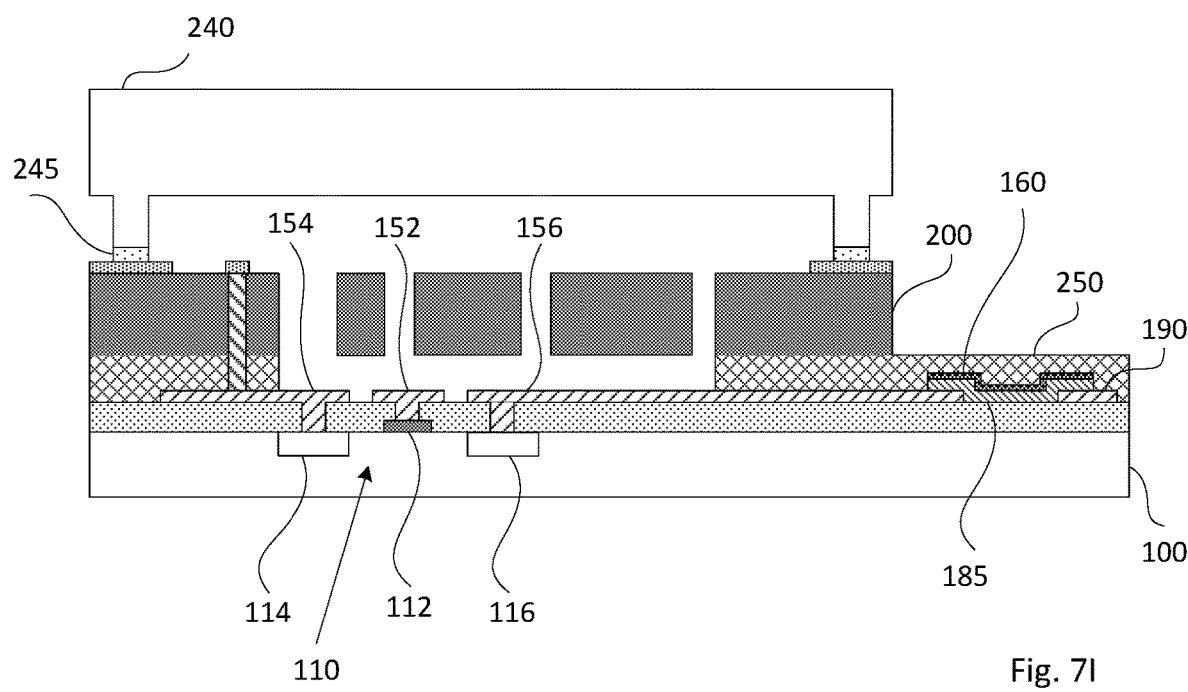

In some embodiments, after the integrated CMOS-MEMS device is fabricated (for example, with the method 300 as shown in FIG. 6), a cap wafer can be bonded to the integrated CMOS-MEMS device. In one example, as shown in FIG. 7I, a cap wafer 240 can be bounded to this second substrate 200 with a bound ring 245. Examples of the materials in the cap wafer 240 can include silicon, quartz, or glass.

Figure 7J:
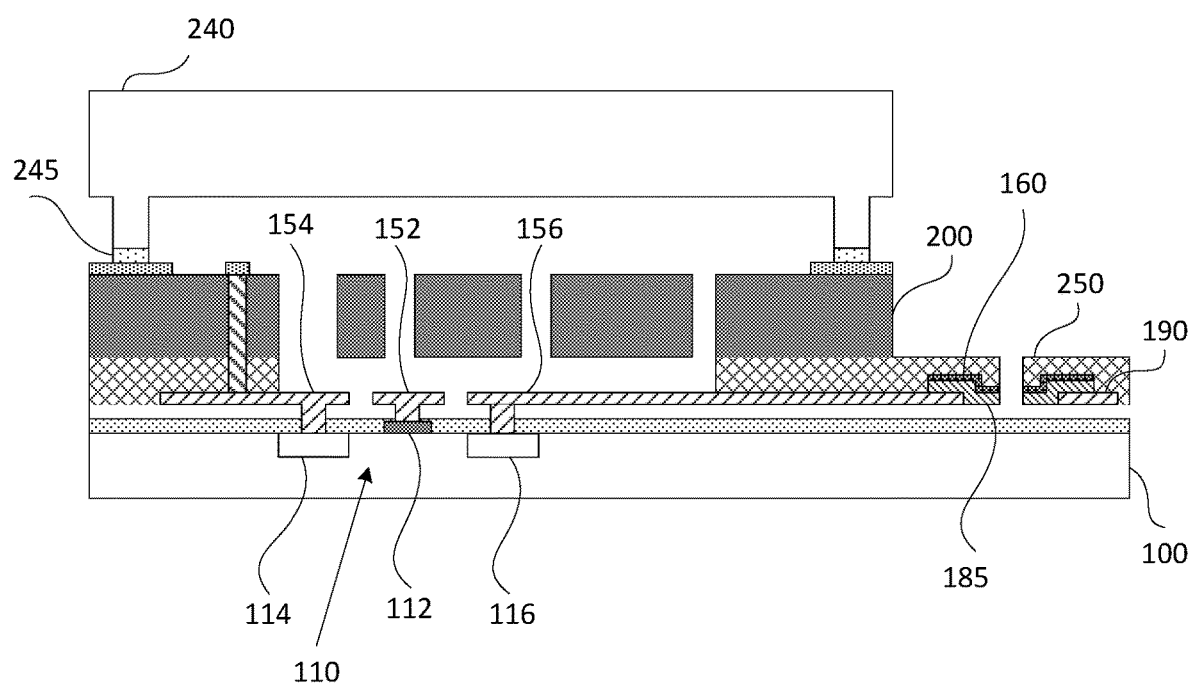

In some embodiments, after the cap wafer is bonded to the integrated CMOS-MEMS device, the electrical bypass structures in the first substrate can be changed to an open configuration. In some embodiments, an electrical bypass structure can include a process-configurable electrical connection that can be changed to an open configuration with an etching process. In the example as shown in FIG. 7J, the electrical bypass structure 185 is changed to an open configuration, and the electrical connection between the conductor 156 and the dischargeable ground-contact 190 is broken. In the example as shown in FIG. 5B, the conductors 152, 154, and 156 can be isolated from the dischargeable ground-contact 190 after gaps 188, 188B, and 188C are opened up by an etching process in which predetermined positions at the conducting layer and the contrast stress layer are selectively etched through. In some embodiments, an electrical bypass structure can include a process-configurable electrical connection that is in the form a fuse-type structure that can be changed to an open configuration with some thermal means, mechanical means, or electrical means.

Figure 8:
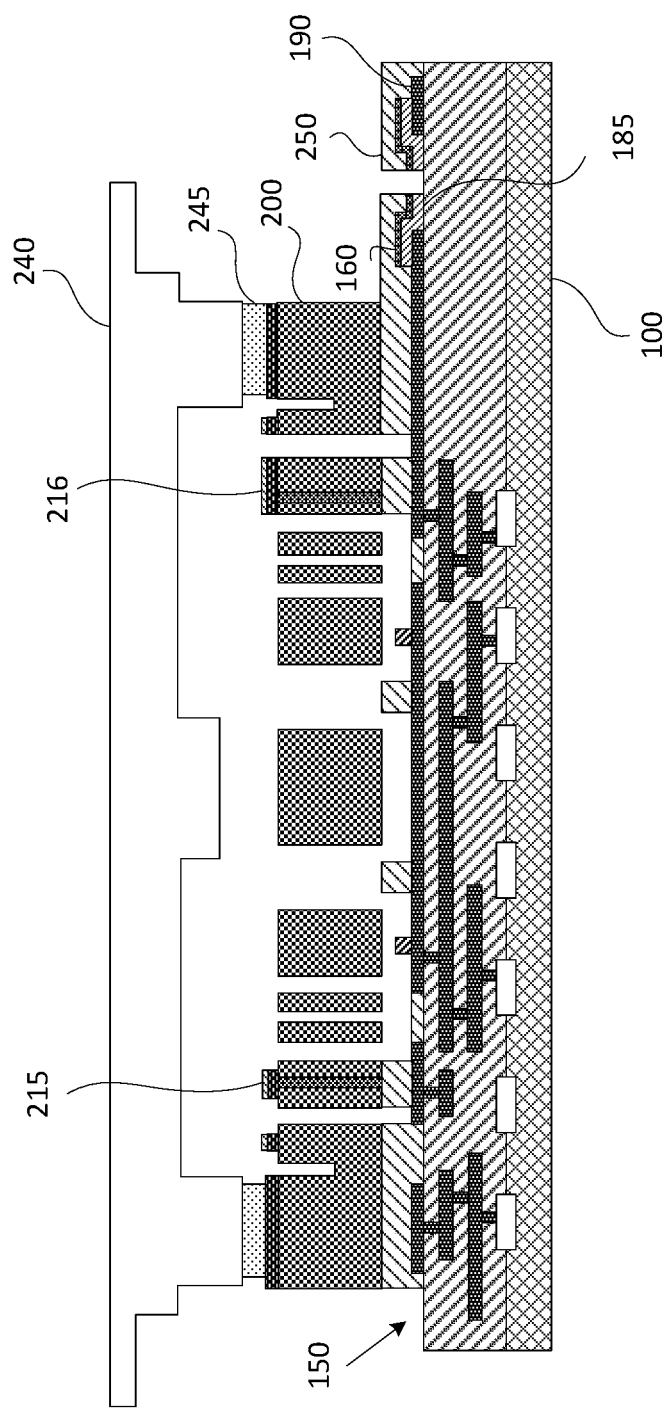
FIG. 8 is a side view showing a cross section of an integrated CMOS-MEMS device with a multilayer interconnect structure in accordance with some embodiments.

FIG. 8 is a side view showing a cross section of an integrated CMOS-MEMS device that includes a multilayer interconnect (MLI) structure in accordance with some embodiments. In FIG. 8, the integrated CMOS-MEMS device includes a first substrate 100, a second substrate 200, an insulator layer 250, a dischargeable ground-contact 190, an electrical bypass structure 185, and a contrast stress layer 160. Additionally, a cap wafer 240 is bounded to this second substrate 200 with a bound ring 245. In FIG. 8, the integrated CMOS-MEMS device also includes a multilayer interconnect (MLI) structure 150. The MLI structure 150 includes various conductive features, such as vertical interconnects, horizontal interconnects in the form of conducting lines, top metal contacts, and/or vias through various insulating layers. Some of the conducting lines in the MLI structure 150 can be formed in the top metal (TM) layer. In some embodiments, some parts of the top metal (TM) layer may be electrically connected to electrical connects in the MEMS device (such as, electrical connects 215 or 216). One or more of the conductive features in the MLI structure 150 may be electrically connected to electronic components in the first substrate 100. Examples of these electronic components include a logic device, a memory device (for example, a static random access memory (SRAM)), a radio frequency (RF) device, an input/output (I/O) device, a system-on-chip (SoC) device, or combinations thereof.

In FIG. 8, the various conductive features in the MLI structure 150 may include conductive materials. Examples of these conductive materials include aluminum, aluminum/silicon/copper alloy, copper, titanium, titanium nitride, tantalum, tantalum nitride, tungsten, polysilicon, metal silicide, or combinations thereof. Various conductive features in the MLI structure 150 may be formed by a process including physical vapor deposition (PVD), chemical vapor deposition (CVD), or combinations thereof. Other manufacturing techniques to form the various conductive features in the MLI structure 150 may include photolithography processing and etching processing to form the vertical and horizontal connects in conductive materials. Still other manufacturing processes may be implemented to form the MLI structure 150, such as a thermal annealing to form metal silicide. The metal silicide used in the multilayer interconnects may include nickel silicide, cobalt silicide, tungsten silicide, tantalum silicide, titanium silicide, platinum silicide, erbium silicide, palladium silicide, or combinations thereof. In some embodiments, the various conductive features in the MLI structure 150 may include aluminum interconnects. In some embodiments, the various conductive features in the MLI structure 150 may include copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof.

Some aspects of the present disclosure relate to an apparatus. The apparatus includes a first substrate, a second substrate, an insulator layer disposed between the first substrate and the second substrate, a dischargeable ground-contact, an electrical bypass structure, and a contrast stress layer. The first substrate includes a complementary metal-oxide-semiconductor (CMOS) device and a conductor that is conductively connecting to the CMOS device. The second substrate includes a microelectromechanical system (MEMS) device. The dischargeable ground-contact is disposed between the first substrate and the insulator layer. The electrical bypass structure has a conducting layer disposed between the first substrate and the insulator layer, and this conducting layer conductively connects the conductor of the first substrate with the dischargeable ground-contact through a process-configurable electrical connection. The contrast stress layer is disposed between the insulator layer and the conducting layer of the electrical bypass structure. An internal stress in the contrast stress layer is opposite in sign to an internal stress in the conducting layer of the electrical bypass structure.

Other aspects of the present disclosure relate to a method. In the method, a first substrate is provided; the first substrate has a complementary metal-oxide-semiconductor (CMOS) device, a conductor connecting to the CMOS device, and a dischargeable ground-contact. An electrical bypass structure is formed by depositing a conducting layer that connects the dischargeable ground-contact with the conductor that is connected to the CMOS device. A contrast stress layer is deposited on the conducting layer of the electrical bypass structure; an internal stress in the contrast stress layer is opposite in sign to an internal stress in the conducting layer of the electrical bypass structure. An insulator layer is deposited; the insulator layer covers the contrast stress layer and the conductor connecting to the CMOS device. A second substrate is provided with the insulator layer sandwiched between the first substrate and the second substrate. A MEMS device is formed in the second substrate. While performing a plasma-environment process in the forming of the MEMS device, charges induced by the plasma-environment process is discharged via the electrical bypass structure.

Other aspects of the present disclosure relate to an apparatus. The apparatus includes a first substrate, a second substrate, an insulator layer disposed between the first substrate and the second substrate, a dischargeable ground-contact, an electrical bypass structure, and a contrast stress layer. The first substrate includes a complementary metal-oxide-semiconductor (CMOS) device and a conductor that is conductively connecting to the CMOS device. The second substrate includes a microelectromechanical system (MEMS) device. The dischargeable ground-contact is disposed between the first substrate and the insulator layer. The electrical bypass structure has a conducting layer disposed between the first substrate and the insulator layer, and this conducting layer conductively connects the conductor of the first substrate with the dischargeable ground-contact through a process-configurable electrical connection. The contrast stress layer is disposed between the insulator layer and the conducting layer of the electrical bypass structure. An internal stress in the contrast stress layer is opposite in sign to an internal stress in the insulator layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   a first substrate comprising a complementary metal-oxide-semiconductor (CMOS) device and a conductor that is conductively connecting to the CMOS device;
   a second substrate comprising a microelectromechanical system (MEMS) device;
   an insulator layer disposed between the first substrate and the second substrate;
   a dischargeable ground-contact disposed between the first substrate and the insulator layer;
   an electrical bypass structure having a conducting layer disposed between the first substrate and the insulator layer, the conducting layer conductively connecting the conductor of the first substrate with the dischargeable ground-contact through a process-configurable electrical connection; and
   a contrast stress layer disposed between the insulator layer and the conducting layer of the electrical bypass structure, wherein an internal stress in the contrast stress layer is opposite in sign to an internal stress in the conducting layer of the electrical bypass structure, and wherein the internal stress of the contrast stress layer is tensile and the internal stress in the conducting layer of the electrical bypass structure is compressive.

2. The apparatus of claim 1, wherein the conductor connecting to the CMOS device includes a metal layer.

3. The apparatus of claim 1, wherein the conducting layer of the electrical bypass structure includes a metal layer.

4. The apparatus of claim 1, wherein the conducting layer of the electrical bypass structure includes a layer of semiconductor.

5. The apparatus of claim 1, wherein the conducting layer of the electrical bypass structure includes a layer of Titanium Nitride.

6. The apparatus of claim 1, wherein the contrast stress layer includes a layer of Titanium.

7. The apparatus of claim 1, wherein the conductor connecting to the CMOS device is isolated from the dischargeable ground-contact when the process-configurable electrical connection is in an open configuration.

8. The apparatus of claim 1, wherein the conductor connecting to the CMOS device is connected to the dischargeable ground-contact when the process-configurable electrical connection is in a closed configuration.

9. A method comprising:
   providing a first substrate that has a complementary metal-oxide-semiconductor (CMOS) device, a conductor connecting to the CMOS device, and a dischargeable ground-contact;
   forming an electrical bypass structure by depositing a conducting layer that connects the dischargeable ground-contact with the conductor that is connected to the CMOS device;
   depositing a contrast stress layer on the conducting layer of the electrical bypass structure, wherein an internal stress in the contrast stress layer is opposite in sign to an internal stress in the conducting layer of the electrical bypass structure;
   depositing an insulator layer covering the contrast stress layer and the conductor connecting to the CMOS device;
   providing a second substrate to have the insulator layer sandwiched between the first substrate and the second substrate; and
   forming a MEMS device in the second substrate, wherein the forming the MEMS device includes performing a plasma-environment process and electrically discharging charges induced by the plasma-environment process via the electrical bypass structure.

10. The method of claim 9, wherein the internal stress of the contrast stress layer is tensile and the internal stress in the conducting layer of the electrical bypass structure is compressive.

11. The method of claim 9, wherein the internal stress of the contrast stress layer is compressive and the internal stress in the conducting layer of the electrical bypass structure is tensile.

12. The method of claim 9, further comprising:
    disconnecting the dischargeable ground-contact from the conductor that is connected to the CMOS device.

13. The method of claim 9, further comprising:
    forming an opening in the conducting layer of the electrical bypass structure to disconnect the dischargeable ground-contact from the conductor that is connected to the CMOS device.

14. The method of claim 9, wherein the forming the electrical bypass structure comprises:
    depositing a layer of Titanium Nitride as the conducting layer of the electrical bypass structure.

15. The method of claim 14, wherein the depositing the contrast stress layer comprises:
    depositing a layer of Titanium on the layer of Titanium Nitride.

16. An apparatus comprising:
    a first substrate comprising a complementary metal-oxide-semiconductor (CMOS) device and a conductor that is conductively connecting to the CMOS device;
    a second substrate comprising a microelectromechanical system (MEMS) device;
    an insulator layer disposed between the first substrate and the second substrate;
    a dischargeable ground-contact disposed between the first substrate and the insulator layer;
    an electrical bypass structure having a conducting layer disposed between the first substrate and the insulator layer, the conducting layer conductively connecting the conductor of the first substrate with the dischargeable ground-contact through a process-configurable electrical connection; and
    a contrast stress layer disposed between the insulator layer and the conducting layer of the electrical bypass structure, wherein an internal stress in the contrast stress layer is opposite in sign to an internal stress in the insulator layer, and wherein the internal stress of the contrast stress layer is compressive and the internal stress in the insulator layer is tensile.

17. The apparatus of claim 16, wherein the internal stress in the conducting layer of the electrical bypass structure is tensile.

18. The apparatus of claim 16, wherein the conductor connecting to the CMOS device includes a metal layer.

19. The apparatus of claim 16, wherein the conducting layer of the electrical bypass structure includes a metal layer.

20. The apparatus of claim 16, wherein the conducting layer of the electrical bypass structure includes a layer of semiconductor.

\* \* \* \* \*